US 11,687,402 B2

(12) United States Patent
Ji et al.

(10) Patent No.: US 11,687,402 B2
(45) Date of Patent: Jun. 27, 2023

(54) DATA TRANSMISSION CIRCUIT AND MEMORY

(71) Applicant: CHANGXIN MEMORY TECHNOLOGIES, INC., Anhui (CN)

(72) Inventors: Kangling Ji, Shanghai (CN); Hongwen Li, Shanghai (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 25 days.

(21) Appl. No.: 17/467,547

(22) Filed: Sep. 7, 2021

(65) Prior Publication Data

US 2022/0066865 A1     Mar. 3, 2022

Related U.S. Application Data

(63) Continuation of application No. PCT/CN2021/100853, filed on Jun. 18, 2021.

(30) Foreign Application Priority Data

Aug. 27, 2020   (CN) .......................... 202010877861.3

(51) Int. Cl.
*G11C 29/00*      (2006.01)
*G06F 11/10*      (2006.01)
(Continued)

(52) U.S. Cl.
CPC ...... *G06F 11/1004* (2013.01); *G06F 11/1068* (2013.01); *G06F 13/1668* (2013.01); *H04B 1/04* (2013.01)

(58) Field of Classification Search
CPC ............. G06F 11/1004; G06F 11/1068; G06F 13/1668; H04B 1/04
See application file for complete search history.

(56) References Cited

U.S. PATENT DOCUMENTS 9,449,720 B1    9/2016  Lung
2006/0268635 A1* 11/2006 Murakoshi ......... G11C 29/4401
                                                365/200
(Continued)

FOREIGN PATENT DOCUMENTS

CN    106710635 A    5/2017
CN    107068194 A    8/2017
(Continued)

OTHER PUBLICATIONS

Supplementary European Search Report in the European application No. 21859806.8, dated Jan. 2, 2023, 10 pgs.

*Primary Examiner* — Samir W Rizk
(74) *Attorney, Agent, or Firm* — Cooper Legal Group, LLC

(57) ABSTRACT

Provided are a data transmission circuit and a memory. The data transmission circuit includes: a normal reading module, which is connected to a normal storage array and configured to read and output data from the normal storage array; a redundant reading module, which is connected to a redundant storage array, and configured to read and output data from the redundant storage array; and an error detection operation module, which is connected to the normal reading module and the redundant reading module respectively, and configured to synchronously receive the read data output from the normal reading module and the redundant reading module, and perform error detection operation on the read data.

16 Claims, 4 Drawing Sheets

(51) Int. Cl.
    *G06F 13/16* (2006.01)
    *H04B 1/04* (2006.01)

(56) References Cited

U.S. PATENT DOCUMENTS

| | | | |
|---|---|---|---|
| 2010/0146330 A1* | 6/2010 | Dhong | G06F 11/1048 |
| | | | 714/E11.071 |
| 2017/0148529 A1 | 5/2017 | Kim et al. | |
| 2018/0336090 A1 | 11/2018 | Minzoni | |
| 2018/0336091 A1 | 11/2018 | Minzoni | |
| 2019/0250985 A1 | 8/2019 | Seo et al. | |
| 2021/0081278 A1 | 3/2021 | Seo et al. | |

FOREIGN PATENT DOCUMENTS

| | | |
|---|---|---|
| CN | 107195329 A | 9/2017 |
| CN | 109785894 A | 5/2019 |
| CN | 110349617 A | 10/2019 |
| CN | 111312321 A | 6/2020 |

\* cited by examiner

DATA TRANSMISSION CIRCUIT AND MEMORY

CROSS-REFERENCE TO RELATED APPLICATIONS

This application is continuation of International application No. PCT/CN2021/100853, filed on Jun. 18, 2021, which claims Chinese application No. 202010877861.3, filed on Aug. 27, 2020 and entitled "DATA TRANSMISSION CIRCUIT AND MEMORY". The contents of International application No. PCT/CN2021/100853 and Chinese application No. 202010877861.3 are hereby incorporated by reference in their entireties.

TECHNICAL FIELD

The present disclosure relates to a data transmission circuit and memory.

BACKGROUND

Semiconductor memories are memories accessed through a semiconductor circuit. Among the semiconductor memories, dynamic random access memory (DRAM) is widely used in various fields for its high storage speed and high integration.

In order to acquire higher flexibility and reliability, a certain number of redundant storage arrays are usually set in the dynamic random access memory to replace them when the normal storage arrays are damaged.

SUMMARY

According to multiple embodiments, a first aspect of the present application provides a data transmission circuit. The data transmission circuit includes a normal reading module, a redundant reading module and an error detection operation module.

The normal reading module is connected to the normal storage array, and is configured to read and output data from the normal storage array;

The redundant reading module is connected to the redundant storage array, and is configured to read and output data from the redundant storage array; and The error detection operation module is connected to the normal reading module and the redundant reading module respectively, and is configured to synchronously receive the read data output from the normal reading module and the redundant reading module, and perform error detection operation on the read data.

Correspondingly and according to multiple embodiments, the second aspect of the present application provides a memory, which includes: multiple normal storage arrays, a redundant storage array, multiple data pin areas, and the above-mentioned data transmission circuit.

The data pin areas have one-to-one correspondence with the normal storage arrays.

The data transmission circuit is connected to the redundant memory array, the normal memory array and the data pin area respectively.

The details of one or more embodiments of the application are set forth in the following drawings and description. Other features and advantages of this application will become apparent from the description, drawings and claims

BRIEF DESCRIPTION OF THE DRAWINGS

In order to more clearly describe the technical solutions in the embodiments of the present application or the traditional technology, the following will briefly introduce the drawings that need to be used in the description of the embodiments or the traditional technology. Apparently, the drawings in the following description are merely the some of the embodiments of the present application, for those of ordinary skilled in the art, other drawings can be obtained based on these drawings without creative work.

Figure 1:
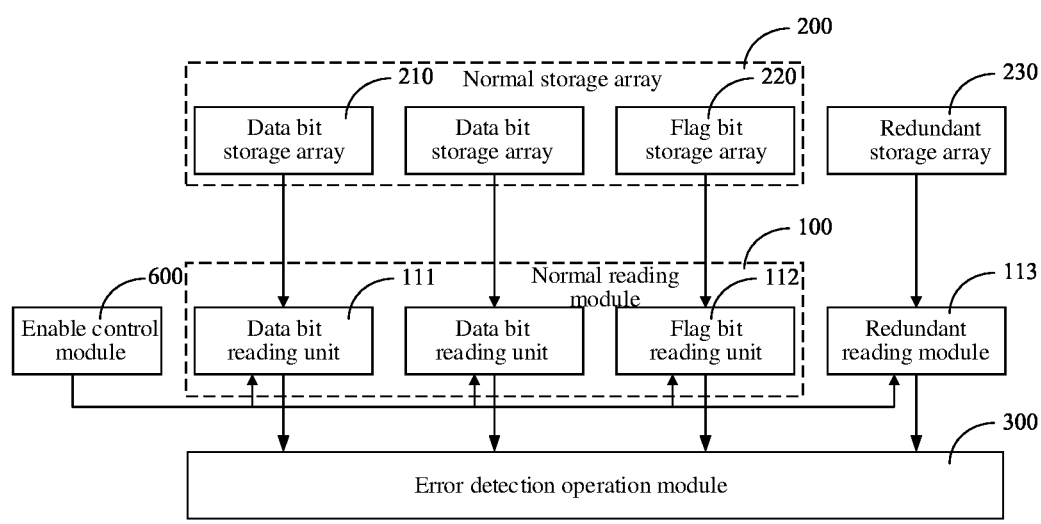
FIG. 1 is a structural block diagram of a data transmission circuit of an embodiment.

Illustration of reference signs: normal reading module 100; data bit reading unit 111; flag bit reading unit 112; redundant reading module 113; data bit writing unit 121; flag bit writing unit 122; redundant writing module 123; logic operation unit 131; first multiplexer 141; normal error correction unit 151; redundant error correction unit 152; write operation unit 161; second multiplexer 171; normal storage array 200; data bit storage array 210; flag bit storage array 220; redundant storage array 230; data pin area 240; error detection operation module 300; redundant data bus 400; flag bit coding module 500; enable control module 600

DETAILED DESCRIPTION

The present data transmission circuit takes long processing time when reading the redundant memory array, the processing speed of the dynamic random access memory is greatly reduced.

In order to facilitate the understanding of the present disclosure, the present disclosure will be described more comprehensively below with reference to the relevant drawings. Some embodiments of the present disclosure are illustrated in the drawings. However, the present disclosure can be implemented in many different forms and is not limited to the embodiments described herein. On the contrary, these embodiments are provided to make the disclosure of the present disclosure more thorough and comprehensive.

Unless otherwise defined, all technical and scientific terms used herein have the same meaning as commonly understood by those skilled in the art of the present disclosure. The terms used in the specification of the present disclosure herein are only for the purpose of describing specific embodiments, and are not intended to limit the present disclosure. The term "and/or" as used herein includes any and all combinations of one or more related listed items.

In the description of the present disclosure, it should be understood that the directions or positional relationships indicated by the terms "upper", "lower", "vertical", "horizontal", "inner", "outer", etc. are based on the figures shown in the drawings, just for the convenience of describing the present disclosure and simplifying the description, rather than indicating or implying that the device or element referred to must have a specific orientation, be constructed and operated in a specific orientation, and therefore cannot be understood as the limitation of the present disclosure.

In the related art, a damaged normal storage array needs to be replaced with a redundant storage array for data reading, it is necessary to first query whether the currently accessed normal storage array is a repaired storage array, if the normal storage array corresponding to the current access address is the repaired storage array, the repaired address is not accessed, but the address of the replacement redundant storage array is accessed, so as to realize data reading. It can be understood that the query to the repaired address and the reading from the redundant storage array in the related art are serial, which results in a lower processing speed.

Further, if the repair of column redundancy is not limited to a small range, but a relatively large range, for example, global repair is performed in the scope of an entire read and write operation, it is required to query the address of the damaged normal storage array first, and read the corresponding redundant storage array for replacement, the required operation time will therefore greatly increase, and the subsequent error detection operation will also take long time, which together lead to decrease in the access speed of the memory.

FIG. 1 is a structural block diagram of a data transmission circuit of an embodiment. Referring to FIG. 1, in this embodiment, the data transmission circuit includes a normal reading module 100, a redundant reading module 113 and an error detection operation module 300.

The normal reading module 100 is connected to the normal storage array 200, and is configured to read data from the normal storage array 200 and output the data. The normal storage array 200 refers to a storage array used when a memory operates normally. The memory includes multiple normal storage arrays 200.

The redundant reading module 113 is connected to the redundant storage array 230, and is configured to read data from the redundant storage array 230 and output the data. The redundant storage array 230 refers to a storage array used for replacement when the normal storage array 200 is damaged. The damage of the normal storage array 200 includes the damage caused during the preparation of the memory and the damage during the use of the memory. The normal storage array 200 and the redundant storage array 230 are prepared at the same time. In general, multiple normal storage arrays 200 correspond to one redundant storage array 230. When the normal storage array 200 is found to be damaged by detection means, the damaged normal storage array 200 is replaced with the redundant storage array 230 through a repair process, the storage array is therefore repaired. After the storage array is repaired, the data to be stored in the damaged normal storage array 200 will be stored in the redundant storage array 230, and if the data in the damaged normal storage array 200 needs to be read, it will be read from the corresponding redundant storage array 230.

The error detection operation module 300 is connected to the normal reading module 100 and the redundant reading module 113 respectively, and is configured to synchronously receive the read data output from the normal reading module 100 and the redundant reading module 113, and perform an error detection operation on the read data.

In this embodiment, both the normal reading module 100 and the redundant reading module 113 are connected to the error detection operation module 300, and send the read data to the error detection operation module 300 in parallel; that is, no matter if the normal storage array 200 is damaged, the normal reading module 100 reads the normal storage array 200, and the redundant reading module 113 reads the redundant storage array 230 synchronously; after the reading is completed, the normal reading module 100 and the redundant reading module 113 synchronously send the read data to the error detection operation module 300. Therefore, there is no need to perform the step of querying the address of the damaged normal storage array 200 first, thereby simplifying the serial step of data reading, and implementing a data transmission circuit with a higher reading speed.

In an embodiment, with continued reference to FIG. 1, the normal storage array 200 includes a flag bit storage array 220 and multiple data bit storage arrays 210, the normal reading module 100 includes a flag bit reading unit 112 and multiple data bit reading units 111.

The data bit reading unit 111 is connected to the data bit storage array 210 in one-to-one correspondence, and is configured to read data information from the corresponding data bit storage array 210.

The flag bit reading unit 112 is connected to the flag bit storage array 220 and is configured to read flag information from the flag bit storage array 220. The flag information corresponds to the data information, that is, unique flag information may be generated according to the data information, and whether the corresponding data information is wrong may be reversely judged according to the flag information. That is, if the data information changes, the flag information will also change accordingly. Therefore, by comparing the flag information corresponding to the written data information with the flag information corresponding to the read data information, it can be determined whether the written data information and the read data information are the same.

It should be noted that for the data bit storage array 210, the data read and write process is effective only when the read data information is made to be the same as the written data information, otherwise the read data information will be wrong. Therefore, if the flag information during writing is the same as the flag information during reading, the written data information is the same as the read data information, and the data read and write process is effective; if the flag information during written is different from the flag information during reading, the written data information is different from the read data information, that is, the data information changes during the writing and/or reading process, it is necessary to perform error correction on the changed data to generate correct read data information. In this embodiment, the error detection operation circuit compares the flag information corresponding to the written data information with the flag information corresponding to the read data information to determine whether it is necessary to perform error correction on the read data information, so as to improve accuracy in data reading.

Further, multiple data bit storage arrays 210 correspond to one flag bit storage array 220, that is, one flag bit storage array 220 is configured to store the flag information corresponding to the data information of multiple data bit storage arrays 210. For example, 16 data bit storage arrays 210 may correspond to one flag bit storage array 220, and correspondingly, 16 data bit reading units 111 correspond to one flag bit reading unit 112.

In an embodiment, the data transmission circuit further includes an enable control module 600. The enable control module 600 is connected to the redundant reading module 113 and multiple data bit reading units 111 respectively. The enable control module 600 is configured to generate a redundant reading enable signal Read Repair and multiple data bit reading enable signals Read kiln, where n is the same as the number of the data bit storage arrays, the data bit reading enable signals Read kiln correspond to the data bit reading units 111 one-to-one, the redundant reading enable signal Read Repair corresponds to the redundant reading module 113, the enable control module 600 is further configured to respectively send the redundant reading enable signal Read Repair and the data bit reading enable signals Read killn to the data bit reading unit 111 or the redundant reading modules 113 in one-to-one correspondence. When the redundant reading enable signal Read Repair is valid, one of the data bit reading enable signals Read killn is invalid; when the redundant reading enable signal Read Repair is invalid, the data bit reading enable signals Read killn are all valid.

For ease of description, in the embodiment of the application, the data bit reading enable signal is named Read killn, and the redundant reading enable signal Read Repair is named Read Repair. Since the data bit reading enable signals Read killn correspond to the data bit reading units 111 one-to-one, the number of the data bit reading enable signals Read killn is the same as the number of data bit reading units 111. For example, if the number of data bit reading units 111 is 16, the number of data bit reading enable signals Read killn is also 16, and the 16 data bit reading enable signals Read killn may be named Read ki to Read kill15 respectively.

Further, the enable control module 600 is also connected to the flag bit reading unit 112, and the enable control module 600 is also configured to generate a flag bit reading enable signal Read killcc, to implement the control of the flag bit reading unit 112.

Before the memory leaves the factory, each data bit storage array 210 of the memory is tested to determine the damaged data bit storage array 210, and each data bit storage array 210 is marked according to the detection result and a lookup table for storing the flag of each data bit storage array 210 is generated. Therefore, the flag determines the data bit reading enable signal Read killn of the corresponding data bit storage array 210. For example, when the data bit storage array 210 is damaged, it is marked as 0, and the correspondingly generated data bit reading enable signal Read killn is invalid; when the data bit storage array 210 is not damaged, it is marked as 1, and the correspondingly generated data bit reading enable signal Read killn is valid.

Further, it takes about 2 ns for the data bit reading unit 111 and the redundant reading module 113 to read data from the corresponding storage array. During this time period, the enable control module 600 reads the above-mentioned lookup table synchronously to obtain information about whether each data bit storage array 210 is damaged, to generate a redundant reading enable signal Read Repair and multiple data bit reading enable signals Read killn according to the queried information.

Figure 2:
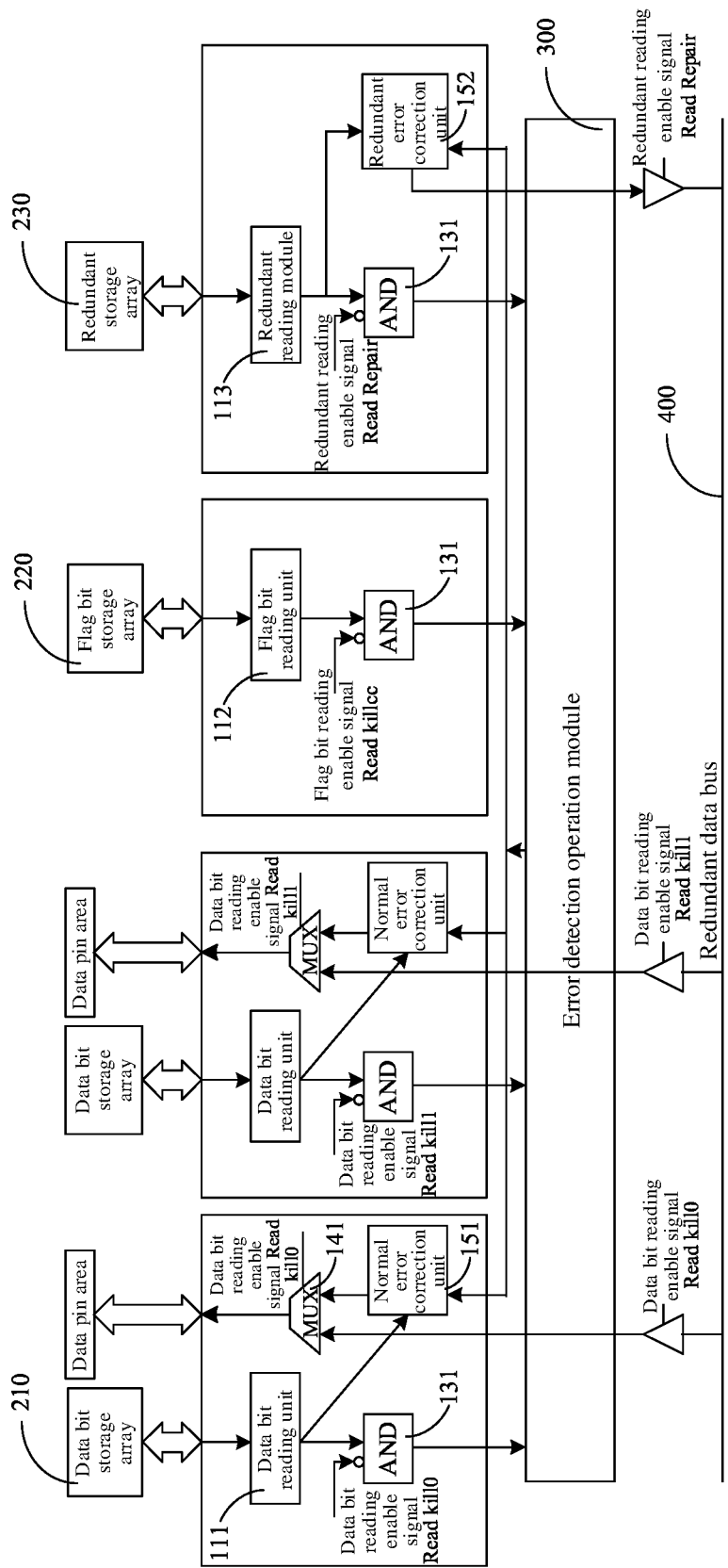
FIG. 2 is a structural diagram of a data transmission circuit of another embodiment.

FIG. 2 is a structural diagram of a data transmission circuit of another embodiment. FIG. 2 shows multiple modules and units related to the data reading process. It should be noted that the memory includes multiple data bit storage arrays 210, such as 8, 16, or 32, etc. However, in order to simplify the drawing, only two data bit storage arrays 210 and their corresponding data transmission structure are shown in FIG. 2, similarly, the drawings of other embodiments of the present application are also simplified, and will not be repeated in other drawings.

Referring to FIG. 2, in this embodiment, the data transmission circuit further includes multiple logic operation units 131. One input end of each logic operation unit 131 corresponds to one of the data bit reading unit 111, the flag bit reading unit 112 and the redundant reading module 113. The other input end of each logic operation unit 131 is connected to the enable signal. The output end of each logic operation unit 131 is connected to the error detection operation module 300. The logic operation unit 131 is configured to perform a preset operation on the data input from the one input end and the other input end, and send the operation result to the error detection operation module 300. In this embodiment, the logic operation unit 131 performs preliminary processing on the received data according to the enable signal, and sends the processed data to the error detection operation module 300, thereby reducing the operation complexity of the error detection operation module 300, to improve the operation speed of the error detection operation module 300.

In an embodiment, each logic operation unit 131 is a logic AND unit. One input end of the logic AND unit is correspondingly connected to one of the data bit reading unit 111, the flag bit reading unit 112, and the redundant reading module 113. The other input end of the logic AND unit is connected to the enable signal. The output end of the logic AND unit is connected to the error detection operation module 300. The logic operation unit 131 is configured to perform a logic AND operation on the data input from the one input end and the other input end, and send the calculation result to the error detection operation module 300.

Specifically, taking the first data bit reading unit 111 and the data bit reading enable signal Read kill0 as an example, a logic AND operation is performed on the data output from the first data bit reading unit 111 and the data bit reading enable signal Read kill0.

When the data bit reading enable signal Read kill0 is 0, it indicates that the corresponding data bit storage array 210 is damaged, and the data output from the data bit reading unit 111 performs a logic AND operation with 0, and the data output from the logic AND unit is all 0. For example, if the data has 8 bits, the logic AND unit corresponding to the data bit reading unit 111 outputs 00000000. At the same time, under the control of the flag bit reading enable signal Read killcc, the logic AND unit corresponding to the flag bit reading unit 112 also outputs 0, based on the above-mentioned operation processing of the logic AND unit, the data information can be matched with the flag information, and error detection result of the error detection operation module 300 is "no error", there is no need to further acquire information of the error data bit through the error detection operation module 300, which simplifies the operation steps and complexity of the error detection operation module 300.

When the data bit reading enable signal Read kill0 is 1, it means that the corresponding data bit storage array 210 is not damaged, a logic AND operation is performed on the data output from the data bit reading unit 111 and 1, the data output from the logic AND unit is data output from data bit reading unit 111. Therefore, the logic operation unit 131 of this embodiment does not affect the data transmission and error detection functions of the undamaged data bit storage array 210, and can reduce the difficulty of data transmission and error detection of the damaged data bit storage array 210, to implement a faster data transmission circuit.

It should be clarified that the each logic operation unit 131 is not limited to the AND unit provided in the foregoing embodiment, and may also be a NAND unit or the like. As long as the logic operation unit 131 can meet the following conditions: when the data bit reading enable signal Read killn is valid, the logic operation unit outputs the data read by the data bit reading unit 111; when the data bit reading enable signal Read killn is invalid, the logic operation unit outputs the preset data. For example, the preset data output from the logic operation unit 131 corresponding to the data bit reading unit 111 may also be 11111111, 01010101, etc., and the preset data output from the logic operation unit 131 corresponding to the flag bit reading unit 112 may be 0.

In an embodiment, the error detection operation module 300 is configured to output multiple pieces of error detection information corresponding to the data bit reading units 111 one-to-one. The data transmission circuit further includes normal error correction units 151, a redundant data bus 400 and a first multiplexer 141. The error detection information includes whether the read data information is the same as the written data information; when the read data information and the written data information are different, the error detection information further includes a specific error data bit, for example, if the written data information is 10000000 and the read data information is 11000000, the error data bit is the second bit.

The normal error correction units 151 are connected to the data bit reading units 111 in one-to-one correspondence, and are also connected to the error detection operation module 300. The normal error correction units 151 are configured to receive error detection information and update the data information output from the corresponding data bit reading units 111 according to the error detection information. Because the data in the memory is stored in binary, when there is an error in reading the data, the error can be corrected directly according to the error detection information. For example, if the data information output from the data bit reading unit 111 is 11000000, and the second bit in the error detection information is marked as an error data bit, the written data information must be 10000000, the normal error correction units 151 can update the data information to implement error correction.

The redundant data bus 400 is connected to the redundant reading module 113, and is configured to receive the data output from the redundant reading module 113. Specifically, after reading data from the redundant storage array 230, the redundant reading module 113 transmits the read data to the redundant data bus 400, such that the first multiplexer 141 corresponding to the damaged data bit storage array 210 can acquire the read data from the redundant data bus 400.

The first multiplexers 141 have one-to-one correspondence with the normal error correction units 151. One input end of each first multiplexer 141 is connected to a corresponding normal error correction unit 151, another input end of each first multiplexer is connected to the redundant data bus 400. The first multiplexer 141 is configured to receive the data bit reading enable signal Read killn, and under the control of the data bit reading enable signal Read killn, select to output the data input by any input end. Specifically, taking the first data bit reading unit 111 and the data bit reading enable signal Read kill0 as an example, when the data bit reading enable signal Read kill0 is 0, it means that the corresponding data bit storage array 210 is damaged, the first multiplexer 141 selects and outputs the data from the redundant data bus 400, that is, the replacement of the data bit storage array 210 by the redundant storage array 230 is implemented; when the data bit reading enable signal Read kill0 is 1, it indicates that the corresponding data bit storage array 210 is not damaged, and the first multiplexer 141 selects to output the data from the normal error correction unit 151, that is, output the data read from the data bit reading unit 111 normally.

In an embodiment, the normal error correction unit 151 is configured to, when the error detection information is invalid, directly send the data information output from the data bit reading unit 111 to the first multiplexer 141. Here, "the error detection information is invalid" means that the read data information is the same as the written data information, and there is no need to perform error correction on the read data information.

In an embodiment, the normal error correction unit 151 is configured to, when the error detection information is valid, perform error correction on the data information output from the data bit reading unit 111 according to the error detection information, to update the data information and send the updated data information to the first multiplexer 141. Here, "the error detection information is valid" means that the read data information is different from the written data information, the read data information needs to be corrected according to the error detection information, to implement the correct output of the data information.

In an embodiment, the normal error correction unit 151 is further configured to, when the error detection information is valid, send the updated data information to the corresponding data bit storage array 210, to update the data information stored in the normal storage array 200. When the read data information and the written data information are different, the data information stored in the corresponding data bit storage array 210 also has the risk of error, therefore, in this embodiment, by updating the data information stored in the data bit storage array 210, the accuracy of the stored data information can be improved, to reduce the amount of error correction of the normal error correction units 151 and increase the operating speed of the data transmission circuit.

In an embodiment, the redundant reading module 113 is configured to, when the redundant reading enable signal Read Repair is valid, send the data read by the redundant reading module 113 to the redundant data bus 400; the first multiplexer 141 is configured to, when the data bit reading enable signal Read kill0 is invalid, select to output the data on the redundant data bus 400. Through the above-mentioned reading method, the redundant storage array 230 can replace the damaged data storage array.

In an embodiment, the error detection operation module 300 is also configured to output error detection information corresponding to the redundant reading module 113. The data transmission circuit further includes a redundant error correction unit 152. The redundant error correction unit 152 is connected to the redundant reading module 113, error detection operation module 300 and redundant data bus 400 respectively. The redundant error correction unit 152 is configured to, when the error detection information is valid, update the output data of the redundant reading module 113 according to the error detection information, and send the updated data to the redundant data bus 400. In this embodiment, the redundant error correction unit 152 is configured to perform error correction on the data read by the redundant reading module 113, to implement the reading accuracy of the redundant reading module 113.

Figure 3:
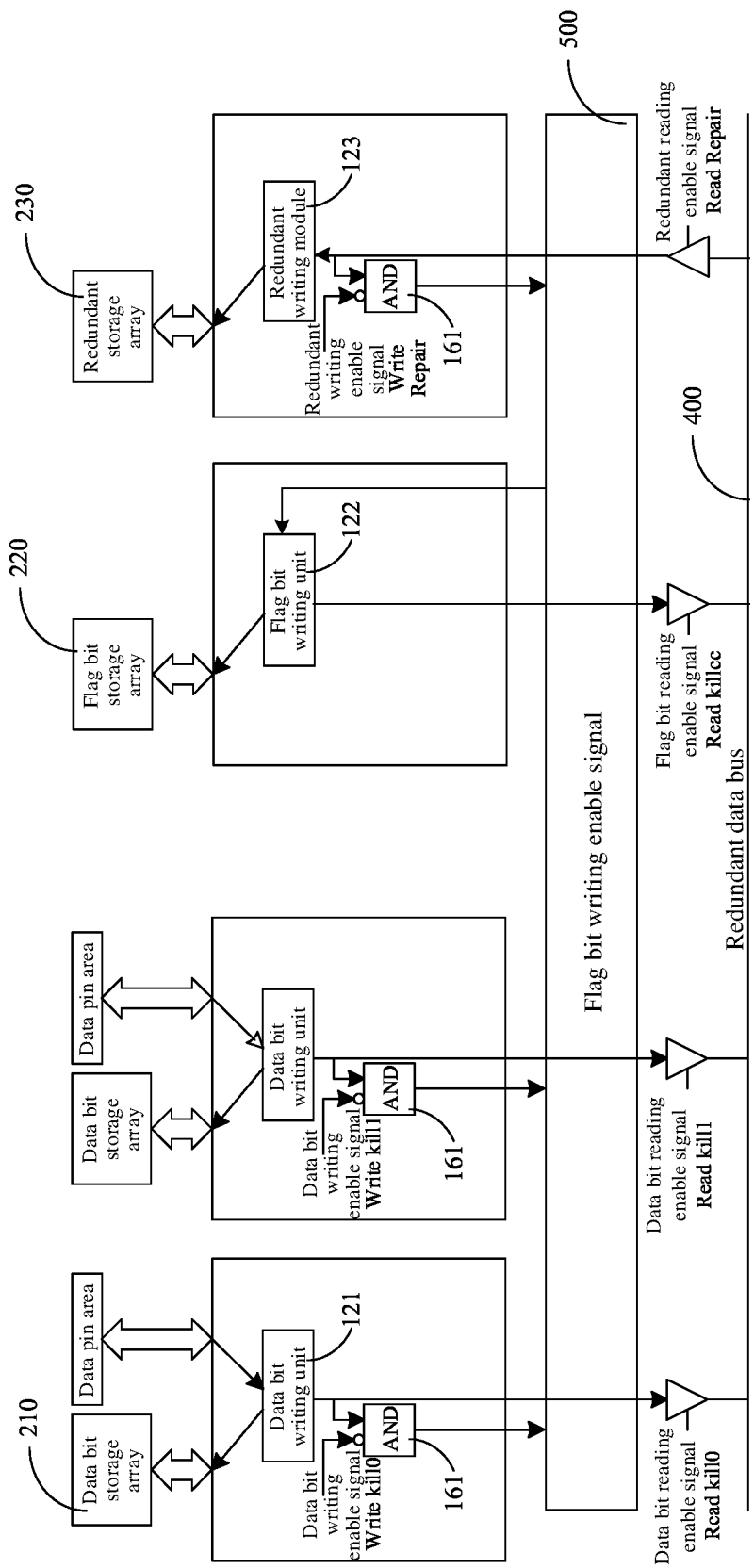
FIG. 3 is a structural diagram of a data transmission circuit of yet another embodiment.

FIG. 3 is a structural diagram of a data transmission circuit according to another embodiment. FIG. 3 shows multiple modules and units related to the data writing process. Referring to FIG. 3, in an embodiment, the data transmission circuit further includes a flag bit writing unit 122, a redundant writing module 123 and multiple data bit writing units 121.

The data bit writing units 121 are connected to the data bit storage arrays 210 in one-to-one correspondence, and are also connected to the redundant data bus 400, and are configured to send data information to the data bit storage array 210 or the redundant data bus 400.

The flag bit writing unit 122 is connected to the flag bit storage array 220 and the redundant data bus 400 respectively, and is configured to send flag information to the flag bit storage array 220 or the redundant data bus 400;

The redundant writing module 123 is connected to the redundant storage array 230 and the redundant data bus 400 respectively, and is configured to write the data on the redundant data bus 400 into the redundant storage array 230.

The data bit writing enable signal Write kill n matches the above-mentioned data bit reading enable signal Read kill n, that is, if the data bit storage array 210 is damaged, the read and write functions are performed by the redundant storage array 230 instead.

Specifically, taking the first data bit reading unit 111 and the data bit writing enable signal Write kill 0 as an example, when the data bit writing enable signal Write kill 0 is 0, it means that the corresponding data bit storage array 210 is damaged, the data bit writing unit 121 sends the received data information to the redundant data bus 400, and send the preset data to the flag bit encoding module 500 through the write operation unit 161 to reduce the coding complexity of the flag bit encoding module 500. The redundant writing module 123 acquires the data information from the redundant data bus 400 and writes it to the redundant storage array 230. When the data bit writing enable signal Write kill 0 is 1, it indicates that the corresponding data bit storage array 210 is not damaged, and the data bit writing unit 121 sends the received data information to the corresponding data bit storage array 210, to implement the normal storage of data information.

In an embodiment, the data transmission circuit further includes a flag bit encoding module 500, which is connected to the data bit writing unit 121 and the flag bit writing unit 122 respectively, and is configured to receive data information output from the data bit writing unit 121, encode the data to generate flag information, and send the flag information to the flag bit writing unit 122. The flag bit encoding module 500 encodes the written data information according to a preset rule to generate unique flag information, and sends the generated flag information to the flag bit writing unit 122, so as to store the flag information for error detection when reading data information.

Figure 4:
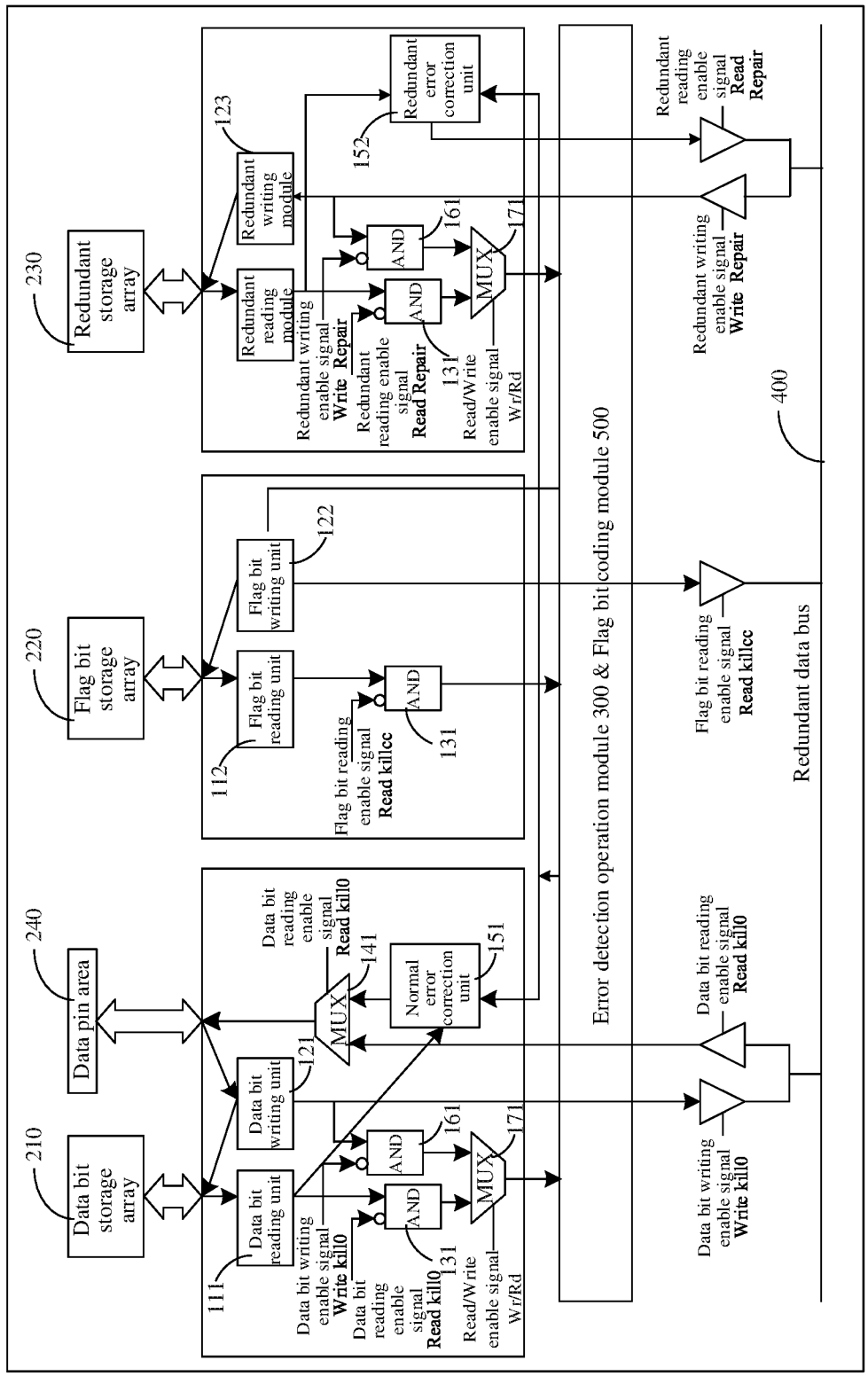
FIG. 4 is a structural diagram of a data transmission circuit of still another embodiment.

FIG. 4 is a structural diagram of a data transmission circuit according to yet another embodiment. FIG. 4 shows multiple modules and units related to the data writing and reading process. Referring to FIG. 4, in this embodiment, the data transmission circuit further includes a second multiplexer 171. One input end and the other input end of the second multiplexer 171 are connected to the data bit reading unit 111 and the data bit writing unit 121 respectively, the second multiplexer 171 is configured to, under the control of the read/write enable signal Wr/Rd, turn on the data transmission path between any input end and the output end in a time-sharing manner to implement the time-sharing writing and reading function of data. In the embodiment of FIG. 4, the error detection operation module 300 is integrated with the flag bit encoding module 500 to improve the integration of the memory. In other embodiments, the error detection operation module 300 and the flag bit encoding module 500 may also be set separately.

Specifically, the first data bit reading unit 111 and the data bit reading enable signal Read kill 0 are taken as an example for specific description. During data writing, the data bit writing unit 121 acquires the data information to be written from the data pin area 240. When the data bit storage array 210 is undamaged, the corresponding data bit writing enable signal Write kill 0 is 1, the data bit writing unit 121 sends the data information to the data bit storage array 210 and the flag bit encoding module 500 respectively, so as to store and encode the data information.

When the data bit storage array 210 is damaged, the corresponding data bit writing enable signal Write kill 0 is 0, the data transmission path between the data bit writing unit 121 and the redundant data bus 400 is turned on, Therefore, the data bit writing unit 121 will also send the redundant data bus 400 the data information. The flag bit encoding module 500 is configured to encode the received data information according to a preset encoding rule to generate flag information, and send the flag information to the flag bit writing unit 122 for storage. When there is a data bit writing enable signal Write kill 0 equal to 0, the redundant writing enable signal Write Repair is 1, the data transmission path between the redundant data bus 400 and the redundant writing module 123 is turned on, the redundant writing module 123 acquires the data information to be written from the redundant data bus 400 and stores it.

During data reading, when the data bit storage array 210 is not damaged, the corresponding data bit reading enable signal Read kill 0 is 1, the data bit reading unit 111 reads the data information from the corresponding data bit storage array 210, and sends the read data information to the normal error correction units 151, the flag bit encoding module 500 and the error detection operation module 300; at the same time, the logic operation unit 131 sends preset data to the second multiplexer 171 under the control of the redundant reading enable signal Read Repair. The flag bit encoding module 500 encodes according to the received data information to generate flag information corresponding to the read data information. The error detection operation module 300 receives flag information corresponding to the read data information, and acquires the flag information corresponding to the written data information from the flag bit reading unit 112. The error detection operation module 300 compares the two flag information to generate error detection information. The normal error correction unit 151 performs error correction on the read data information according to the error detection information and outputs to the data pin area 240.

When the data bit storage array 210 is damaged, the corresponding data bit reading enable signal Read kill 0 is 0, the redundant reading enable signal Read Repair is 1, the redundant reading module 113 sends the read data to the redundant error correction unit 152, the flag bit encoding unit and the error detection operation module 300 to perform the error detection and correction steps; at the same time, the logic operation module corresponding to the damaged data bit storage array 210 sends the error detection operation module 300 the preset data value, reducing the operation complexity of the error detection operation module 300. After processing the received data information, the redundant error correction unit 152 sends the redundant data bus 400 the data information. The data bit reading enable signal Read kill 0 turns on the data transmission path between the first multiplexer 141 corresponding to the damaged data bit storage array 210 and the redundant data bus 400. The first multiplexer 141 corresponding to the damaged data bit storage array 210 acquires data information from the redundant data bus 400, and sends the data information to the data pin area 240 under the control of the data bit reading enable signal Read kill 0.

The embodiment of the present application also provides a memory, including: multiple normal storage arrays 200; a redundant storage array 230; multiple data pin areas 240; the data pin areas 240 corresponding to the normal storage arrays 200 one-to-one; data transmission circuit as described above is connected to the redundant storage array 230, the normal storage array 200 and the data pin area 240 respectively. No matter if whether the normal storage array 200 is damaged, the memory of this embodiment does not need to perform the step of querying the address of the damaged normal storage array 200 first, which simplifies the serial step of data reading, to achieve memory with a higher reading speed.

The technical features of the above embodiments can be combined arbitrarily, in order to make the description concise, not all possible combinations of the technical features in the above embodiments are described. However, as long as there is no contradiction in the combination of these technical features, it should be regarded as the scope described in this specification.

The above embodiments only express several implementation modes of the present disclosure, the description is more specific and detailed, but it should not be understood as the limitation on the scope of the disclosure patent. It should be pointed out that for those of ordinary skilled in the art, without departing from the concept of the present disclosure, several modifications and improvements can be made, and these all fall within the protection scope of the present disclosure. Therefore, the protection scope of the patent of the present disclosure should be subject to the appended claims.

What is claimed is:

1. A data transmission circuit, wherein the data transmission circuit comprises:
   a normal reading module, which is connected to a normal storage array, and is configured to read and output data from the normal storage array;
   a redundant reading module, which is connected to a redundant storage array, and is configured to read and output data from the redundant storage array; and
   an error detection operation module, which is connected to the normal reading module and the redundant reading module respectively, and is configured to synchronously receive the read data output from the normal reading module and the redundant reading module, and perform an error detection operation on the read data.

2. The data transmission circuit according to claim 1, wherein the normal storage array comprises a flag bit storage array and a plurality of data bit storage arrays, the normal reading module comprises:
   a plurality of data bit reading units, wherein the data bit reading units are connected to the data bit storage arrays in one-to-one correspondence, and are configured to read data information from the corresponding data bit storage arrays; and
   a flag bit reading unit, which is connected to the flag bit storage array, and is configured to read flag information from the flag bit storage array.

3. The data transmission circuit according to claim 2, further comprising:
   a plurality of logic operation units, wherein one input end of each logic operation unit is correspondingly connected to one of the data bit reading unit, the flag bit reading unit and the redundant reading module, another input end of the each logic operation unit is connected to an enable signal, an output end of the each logic operation unit is connected to the error detection operation module, and the logic operation unit is configured to preprocess the data input from the one input end and the another input end and send an operation result to the error detection operation module.

4. The data transmission circuit according to claim 3, wherein the each logic operation unit is a logic AND unit, one input end of the logic AND unit is correspondingly connected to one of the data bit reading units, the flag bit reading units, and the redundant reading modules, another input end of the logic AND unit is connected to the enable signal, an output end of the logic AND unit is connected to the error detection operation module, and the each logic operation unit is configured to perform a logic AND operation on the data input by the one input end and the another input end and send an operation result to the error detection operation module.

5. The data transmission circuit according to claim 3, further comprising:
   an enable control module, which is connected to more than one logic AND unit of the logic AND units respectively and is configured to generate a redundant reading enable signal and a plurality of data bit reading enable signals, the data bit reading enable signals correspond to the data bit reading units one-to-one, and the redundant reading enable signal corresponds to the redundant reading module, the enable control module is further configured to send the redundant reading enable signals and the data bit reading enable signal to the more than one logic AND unit in one-to-one correspondence;
   wherein, in case where the redundant reading enable signal is valid, one of the plurality of data bit reading enable signals is invalid; in case where the redundant reading enable signal is invalid, the plurality of data bit reading enable signals are all valid.

6. The data transmission circuit according to claim 5, wherein the error detection operation module is configured to output a plurality of pieces of error detection information, the piece of error detection information corresponds to the data bit reading units one-to-one, the data transmission circuit further comprises:
   a normal error correction unit, which is connected to the data bit reading units in one-to-one correspondence and is also connected to the error detection operation module, wherein the normal error correction unit is configured to receive the error detection information, and update the data information output from a corresponding data bit reading unit according to the error detection information;
   a redundant data bus, which is connected to the redundant reading module and is configured to receive data output from the redundant reading module; and
   a plurality of first multiplexers, wherein the first multiplexers correspond to the normal error correction units one-to-one, and one input end of the first multiplexer is connected to the corresponding normal error correction units, another input end of the first multiplexer is connected to the redundant data bus, and the first multiplexer is configured to receive the data bit reading enable signal, and select and output data input from any one of the input ends under the data bit reading enable signal.

7. The data transmission circuit according to claim 6, wherein the normal error correction units are configured to send the first multiplexer the data information output from the data bit reading unit in case where the error detection information is invalid.

8. The data transmission circuit according to claim 7, wherein that the error detection information is invalid means that the read data information is the same as written data information, and the read data information requires no error correction.

9. The data transmission circuit according to claim 6, wherein the normal error correction units are configured to, in case where the error detection information is valid, perform error correction on the data information output from the data bit reading unit according to the error detection information to update the data information, and send the updated data information to the first multiplexer.

10. The data transmission circuit according to claim 9, wherein the normal error correction units are further configured to, in case where the error detection information is valid, send the updated data information to the corresponding data bit storage array to update the data information stored in the normal storage array.

11. The data transmission circuit according to claim 9, wherein that the error detection information is valid means that the read data information is different from written data information, and the read data information requires error correction according to the error detection information, to implement correct output of the data information.

12. The data transmission circuit according to claim 6, wherein the redundant reading module is configured to send the data read by the redundant reading module to the redundant data bus in case where the redundant reading enable signal is valid;
the first multiplexer is configured to select and output the data on the redundant data bus in case where the data bit reading enable signal is invalid.

13. The data transmission circuit according to claim 6, wherein the error detection operation module is further configured to output error detection information corresponding to the redundant reading module, the data transmission circuit further comprises:
a redundant error correction unit, wherein the redundant error correction unit is respectively connected to the redundant reading module, the error detection operation module and the redundant data bus, the redundant error correction unit is configured to, in case where the error detection information is valid and the redundant reading enable signal is valid, update the date output from the redundant reading module according to the error detection information and send the updated data to the redundant data bus.

14. The data transmission circuit according to claim 6, further comprising:
a plurality of data bit write units, which are connected to the plurality of data bit storage arrays in one-to-one correspondence and are also connected to the redundant data bus, and are configured to send data information to the data bit storage arrays or the redundant data bus;
a flag bit write unit, which is respectively connected to the flag bit storage arrays and the redundant data bus, and is configured to send flag information to the flag bit storage arrays or the redundant data bus; and
a redundant write module, which is respectively connected to the redundant storage arrays and the redundant data bus, and is configured to write data on the redundant data bus into the redundant storage arrays.

15. The data transmission circuit according to claim 14, further comprising:
a flag bit encoding module, which is respectively connected to the data bit write units and the flag bit write unit, and is configured to receive the data information output from the data bit write units, encode the data to generate the flag information, and send the flag information to the flag bit write units.

16. A storage device, comprising:
a plurality of normal storage arrays;
a redundant storage array;
a plurality of data pin areas, wherein the data pin areas are correspond to the normal storage arrays one-to-one; and
a data transmission circuit,
wherein the data transmission circuit comprises:
a normal reading module, which is connected to a normal storage array, and is configured to read and output data from the normal storage array;
a redundant reading module, which is connected to a redundant storage array and is configured to read and output data from the redundant storage array; and
an error detection operation module, which is connected to the normal reading module and the redundant reading module respectively, and is configured to synchronously receive the read data output from the normal reading module and the redundant reading module, and perform an error detection operation on the read data,
wherein the data transmission circuit is respectively connected to the redundant storage array, the normal storage arrays and the data pin areas.

* * * * *